United States Patent [19]

Poli et al.

[11] Patent Number: 4,736,508
[45] Date of Patent: Apr. 12, 1988

[54] PROCESS OF MANUFACTURING VACUUM TIPS PARTICULARLY FOR VACUUM HANDLING SYSTEMS

[75] Inventors: Bernard Poli, Roche la Molière; Gérard Chincholle, Saint Etienne, both of France

[73] Assignee: RECIF (société anonyme), Saint-Etienne, France

[21] Appl. No.: 940,534

[22] Filed: Dec. 10, 1986

[30] Foreign Application Priority Data

Dec. 10, 1985 [FR] France ................. 85 18636

[51] Int. Cl.⁴ ............... B23P 9/00; B21D 39/04; B23K 1/00
[52] U.S. Cl. ........................ 29/445; 29/560; 29/517; 29/157 C; 228/133; 228/136; 228/173.2; 228/174; 294/64.1
[58] Field of Search ........... 29/517, 445, 460, 157 C; 294/64.1; 228/132, 133, 136, 174, 173.2

[56] References Cited

U.S. PATENT DOCUMENTS

| | | | |
|---|---|---|---|
| 3,579,807 | 5/1971 | Matulewicz | 228/173.2 X |
| 3,581,376 | 6/1971 | Pilling | 29/445 X |
| 4,050,729 | 9/1977 | Hutson | 294/64.1 |
| 4,424,622 | 1/1984 | Krause | 29/460 X |
| 4,496,180 | 1/1985 | Hillman et al. | 294/64.1 |
| 4,602,732 | 7/1986 | Schaeffer et al. | 228/173.2 X |
| 4,613,839 | 9/1986 | Foglesonger et al. | 228/174 X |
| 4,618,178 | 10/1986 | Hutson et al. | 294/64.1 |
| 4,660,267 | 4/1987 | Wheeler | 29/445 X |
| 4,687,242 | 8/1987 | Rooy | 294/64.1 |

FOREIGN PATENT DOCUMENTS

| | | | |
|---|---|---|---|
| 2628488 | 1/1978 | Fed. Rep. of Germany | 294/64.1 |
| 2631502 | 1/1978 | Fed. Rep. of Germany | 294/64.1 |
| 33678 | 3/1979 | Japan | 294/64.1 |
| 61171 | 4/1985 | Japan | 228/173.2 |

Primary Examiner—Charlie T. Moon
Attorney, Agent, or Firm—Eric P. Schellin

[57] ABSTRACT

The object of the invention relates to the technical sector of microelectronics. According to the process, one starts off with a hollow stainless steel tube (1) of determined diameter; the tube (1) is shrunk for a certain length (1a) and flattened, the remaining part is flattened to form two opposite flat non close joining faces (1b) and (1c); a slot (1b1) is machined in one of the flattened faces (1b) and a hole (1c1) in the other face (1c); a blade (2) provided with an axial notch (2a) on one of its edges is inserted between the two faces (1b) and (1c); through the hole (1c1) formed in one of the faces, a powder is inserted, designed to carry out microbrazing after heating; the assembly is placed in to a furnace to insure bracing of the blade (2) with the flattened parts and simultaneously filling by microbrazing remaining cavities between the blades and the flattened parts; the ends of the flattened gripping parts are rounded off; the flattened gripping areas are ground.

4 Claims, 1 Drawing Sheet

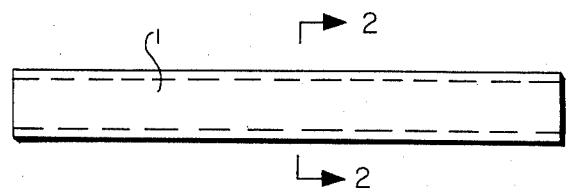
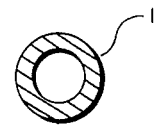
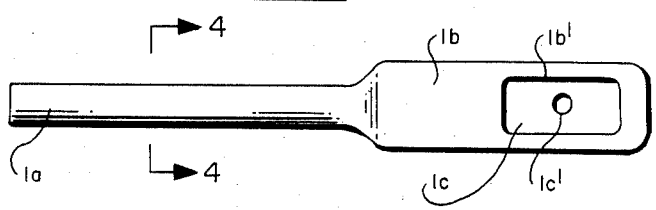
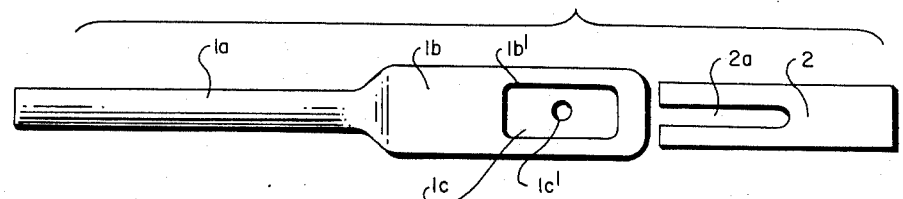
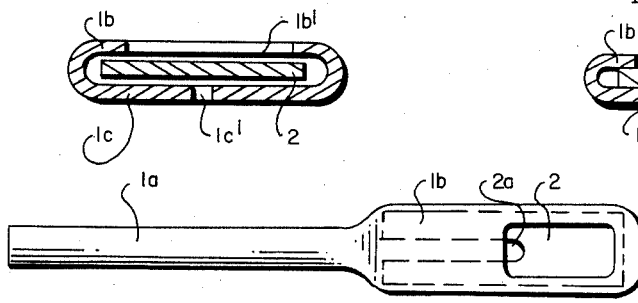
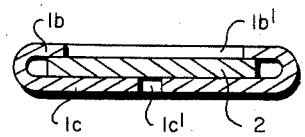
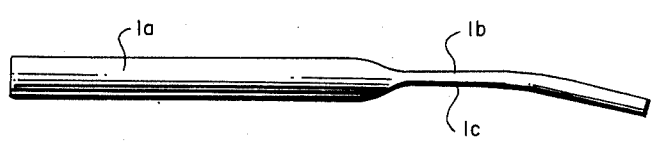
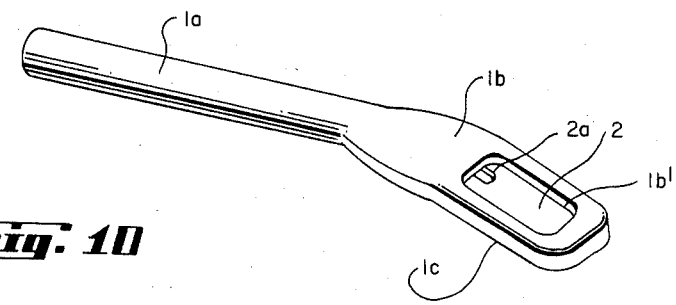

PROCESS OF MANUFACTURING VACUUM TIPS PARTICULARLY FOR VACUUM HANDLING SYSTEMS

This invention relates to a process of manufacturing tips particularly for vacuum handling systems and the tip obtained by the implementing of this process.

The object of this invention relates to the technical sector of microelectronics.

The use of tips for vacuum handling systems is known, designed to insure the gripping by suction of certain components especially silicon wafers. In general, these tips are of quartz or stainless steel.

The quartz tips are of a fairly high cost and fragile in use. As for the steel tips, due to their technological design, give rise to problems of contamination of wafers and risks of air leakage, which can hinder a good wafer gripping. The problem being posed, the object of the invention is to remedy these disadvantages by deveoping a manufacturing process which is remarkable by the following phases:

One starts off with a hollow stainless steel tube of determined diameter, the tube is shrunk for a certain length and the remainder is flattened to form two opposite flat non close joining faces, in one of the flattened faces a slot is machined and in the other a hole, a blade provided with an axial notch on one of its edges is inserted between the two faces, the two flat faces are flattened on the blade, through the hole formed in one of the faces, a powder is placed, designed to carry out microbrazing after heating, the assembly is placed in a furnace to insure the assembly by brazing of the blade with the flattened parts and simultaneously filling by micro-brazing of the remaining cavities between the blade and the flattened parts, the ends of the flattened gripping parts are rounded off, the flattened gripping areas are ground.

The invention is described below in more detail by the accompanying drawings which only represent an embodiment:

FIGS. 1, 2, 3, 4, 5, 6, 7, 8, and 9 illustrate the main phases of the process,

FIG. 1 is a view of a tube,

FIG. 2 is a cross sectional view taken on the line 2—2 of FIG. 1,

FIG. 3 is a view of a tube shrunk on one end and flattened on the other end,

FIG. 4 is a cross sectional view taken on the line of 4—4 of FIG. 3,

FIG. 5 is a view of a blade and tube assembling operation,

FIG. 6 is a cross sectional view on a larger scale of the gripping part before flattening of the opposite flat faces, FIG. 7 is a cross sectional view on a larger scale of the gripping part after flattening of the opposite flat faces, FIG. 8 is a view of an assembled blade and tube, FIG. 9 is a view of a blade and tube assembly with a bent vacuum gripping portion, FIG. 10 is a perspective view of an example of embodiment of the tip executed according to the process of the invention.

The object of the invention will become more apparent form the following non limiting detailed description, when considered in conjuction with the accompanying drawings.

The tip is obtained starting from a hollow tube (1) particularly of stainless steel and determined diameter (FIGS. 1 and 2). According to the invention, the tube (1) is shrunk for a certain length (1a). As guidance, if the tube (1) has an initial diameter of 9 mm, after shrinking, the diameter is 6.2 mm (FIG. 4). The remaining part is flattened to form two parallel flat faces (1b) and (1c) placed opposite one another in a non close joining manner (FIGS. 3 and 5).

An axial oblong slot (1b1) is machined in the thickness of one of the faces (1b) and in the other face (1c) a hole (1c1) (FIG. 3). Then a blade (2), of the same material as the tube (1), is inserted between the two opposite faces (1b) and (1c).

This blade is provided with an axial notch (2a) from one of its cross edges. After inserting the blade (2) in the flattened part, the notch is positioned to the side of the shrunk tube (1a) and leaves, in combination with the edge corresponding to the slot (1b1), a free area (a) which acts as a vacuum storage room and conditions the gripping force of the tip.

Next, the two flat faces (1b) and (1c) are then flattened on the blade (2) (FIG. 6) and a powder designed to carry out microbrazing after heating, is inserted through the hole (1c1). The assembly is placed in a furnace to insure brazing of the blade (2) with the flattened part (1b-1c) and simultaneously filling through microbrazing of remaining cavities particularly between the blade (2) and the flattened part (FIG. 7).

The ends of the flat part (FIG. 8) are rounded off and are then ground. The gripping area thus established can then be folded according a determined angle and in function of applications required.

The whole of the tip is provided with a high tensile fluorinated copolymer coating thereby injecting nitrogen to avoid plugging and contamination. This coating is, for example, known under the name of HALAR.

Or, according to a preferred embodiment, the whole of the tip is provided with a polyetheretherketone coating, known under the PEEK trademark. The advantages will become more apparent from the description. In particular, we underline that the rounded off corners and the outside coating greatly reduces the risks of contamination and scratching the wafers. In the same way, the microbrazing suppresses any risk of leakage.

Finally, with the process according to the invention, due to the fact of the tube shrinking, the width of the tip gripping part can be reduced, which proves to be particularly advantageous when gripping certain wafers as close as possible to their edges, without risk of damaging the chips.

The invention is in no way limited to the type of application or embodiment discussed herein; but it is to be understood that many variations and modifications will readily occur. For example, the tip such as defined, i.e. particularly with a shrunk cylindrical part (1a) in order to be inserted into the body of a vacuum handling system and a gripping part (1b-1c) of a variable diameter and reduced width, can be made of any material, especially quartz.

It is also planned to manufacture this particular form of tip by molding, by injection of a polyetheretherketone material known under the PEEK trademark.

What is claimed is:

1. Process of manufacturing tips adaptable especially to vacuum handling systems, comprising providing a hollow stainless steel tube (1) of determined diameter, shrinking the diameter of the tube (1) by deforming over a portion of the length of said tube and flattening the remaining part of said tube to form two opposite flat non-closed-spaced joining faces (1b) (1c), machining in one of the flattened faces (1b), as slot (1b1) and in the other (1c) a hole (1c1), inserting a blade (2) provided with an axial notch (2a) in one of its edges, with the edge having the notch first, between the two spaced faces with said notch exposed to said slot, flattening the two flat faces (1b) and (1c) on the blade (2), inserting through the hole (1c1) formed in one of the faces, a powder to insure microbrazing after heating, placing the assembly in a furnace to cause brazing of the blade (2) with the two flattened parts and simultaneously filling remaining cavities between the blades and the flattened parts except said notch by microbrazing, rounding off the ends of the flattened gripping parts, grinding the flattened gripping areas in said one face having said slot therein.

2. Process as claimed in claim 1, wherein the gripping area is bent at an angle.

3. Process as claimed in claim 1, further including coating the surface of the tip assembly with a high tensile fluorinated copolymer thereby injecting nitrogen.

4. Process as claimed in claim 1, further including coating the surface of the tip assembly with a polyetheretherketone coating.

* * * * *